(12) United States Patent
Qi et al.

(10) Patent No.: US 9,946,152 B2
(45) Date of Patent: Apr. 17, 2018

(54) EXTREME ULTRAVIOLET LITHOGRAPHY PHOTOMASKS

(71) Applicant: GLOBALFOUNDRIES INC., Grand Cayman (KY)

(72) Inventors: Zhengqing John Qi, Albany, NY (US); Christina A. Turley, Colchester, VT (US); Jed H. Rankin, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 50 days.

(21) Appl. No.: 15/139,994

(22) Filed: Apr. 27, 2016

(65) Prior Publication Data

US 2017/0315438 A1    Nov. 2, 2017

(51) Int. Cl.
*G03F 1/24* (2012.01)
*G03F 1/22* (2012.01)

(52) U.S. Cl.
CPC ..................... *G03F 1/24* (2013.01)

(58) Field of Classification Search
None
See application file for complete search history.

(56) References Cited

U.S. PATENT DOCUMENTS

| 6,815,129 | B1 | 11/2004 | Bjorkholm et al. |
| 7,101,645 | B1 | 9/2006 | La Fontaine et al. |
| 2005/0266317 | A1* | 12/2005 | Gallagher ............ B82Y 10/00 430/5 |
| 2012/0135339 | A1 | 5/2012 | Kim et al. |
| 2012/0237860 | A1 | 9/2012 | Kim et al. |
| 2013/0189608 | A1* | 7/2013 | Oh .......................... G03F 1/24 430/5 |
| 2014/0218714 | A1* | 8/2014 | Hsu ......................... G03F 1/14 355/77 |

FOREIGN PATENT DOCUMENTS

| CN | 1259760 | 7/2000 |
| JP | 2002299228 | 10/2002 |
| TW | 200539299 | 12/2005 |
| TW | 201543138 | 11/2015 |

OTHER PUBLICATIONS

German Office Action in the related DE Application No. 102016209765.2 dated Dec. 7, 2016, 4 pages.

(Continued)

*Primary Examiner* — Stephen Rosasco
(74) *Attorney, Agent, or Firm* — Michael LeStrange; Andrew M. Calderon; Roberts Mlotkowski Safran Cole & Calderon, P.C.

(57) ABSTRACT

The present disclosure relates to semiconductor structures and, more particularly, to modified surfaces of extreme ultraviolet lithography photomasks and methods of manufacture. The structure includes a reflective surface having a patterned design, and a black border region at edges of the patterned design. The black border region includes a modified surface morphology to direct light away from reaching a subsequent mirror.

20 Claims, 2 Drawing Sheets

(56) References Cited

OTHER PUBLICATIONS

Huang et al., "Spectral purity enhancement for the EUV Lithography Systems by suppressing UV reflection from multilayers". Proc. of SPIE vol. 9048, 90480G-2, 2014, 5 pages.
Davydova et al., "Impact of an etched EUV mask black border on imaging. Part II.", Proc. of SPIE vol. 8880 888027-1, 2013, 12 pages.
Taiwanese Office Action in the related TW Application No. 10620133290 dated Feb. 8, 2017, 11 pages.
Taiwanese Notice of Allowance in the related TW Application No. 105116235 dated Oct. 19, 2017, 3 pages.

* cited by examiner

US 9,946,152 B2

EXTREME ULTRAVIOLET LITHOGRAPHY PHOTOMASKS

FIELD OF THE INVENTION

The present disclosure relates to photomask structures and, more particularly, to modified surfaces of extreme ultraviolet lithography photomasks and methods of manufacture.

BACKGROUND

Extreme ultraviolet (EUV) lithography is poised to complement and eventually replace conventional deep ultraviolet (DUV) lithography due to the significantly narrower illumination wavelength ($\lambda=13.5$ nm), providing enhanced patterning resolution and lower process complexity, among other benefits. EUV is currently being developed for possible future use in combination with immersion lithography at 32 nm pitch resolution, sometimes referred to as the 7 nm node.

Optical elements used in EUV lithography are based on reflective rather than refractive optics. EUV mirrors consist of alternating layers of material (e.g., Mo and Si), also called the multilayer. EUV photomasks utilize a reflective coating in addition to an EUV absorber material that has been etched (patterned) to represent the intended circuit design. However, current absorbers used in EUV lithography do not absorb all EUV light and, in fact, have a reflectivity of about 1-3%, depending on absorber height. EUV photomasks also exhibit overlapping shots from neighboring fields, which can cause 1.5%-5.0% extra background light on edges and 4.5%-15% on corners of the circuit designs. The wafer critical dimension (CD) impact can be upwards of about 1 nm/%, causing large critical dimension (CD) drop.

SUMMARY

In an aspect of the disclosure, a structure comprises: a reflective surface comprising a patterned design; and a black border region at edges of the patterned design. The black border region comprises a modified surface morphology to direct light away from reaching a subsequent mirror.

In an aspect of the disclosure, a structure comprises: a substrate; a backside metal on a surface of the substrate; a reflective surface on an opposing surface of the substrate, comprising a plurality of alternating layers of relative high and low atomic number materials; a protective coating on the reflective surface; an absorber layer on the protective coating; a patterned design formed within the absorber layer, to the protective coating; and a black border region formed through the reflective surface, the protective coating and the absorber layer, exposing a surface of the substrate. The black border region comprises a modified surface morphology of the substrate.

In an aspect of the disclosure, a method comprises: forming a black border region in a mask; and modifying a surface morphology of the black border region to cause light scattering of deep ultra violet light from reaching a next mirror.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
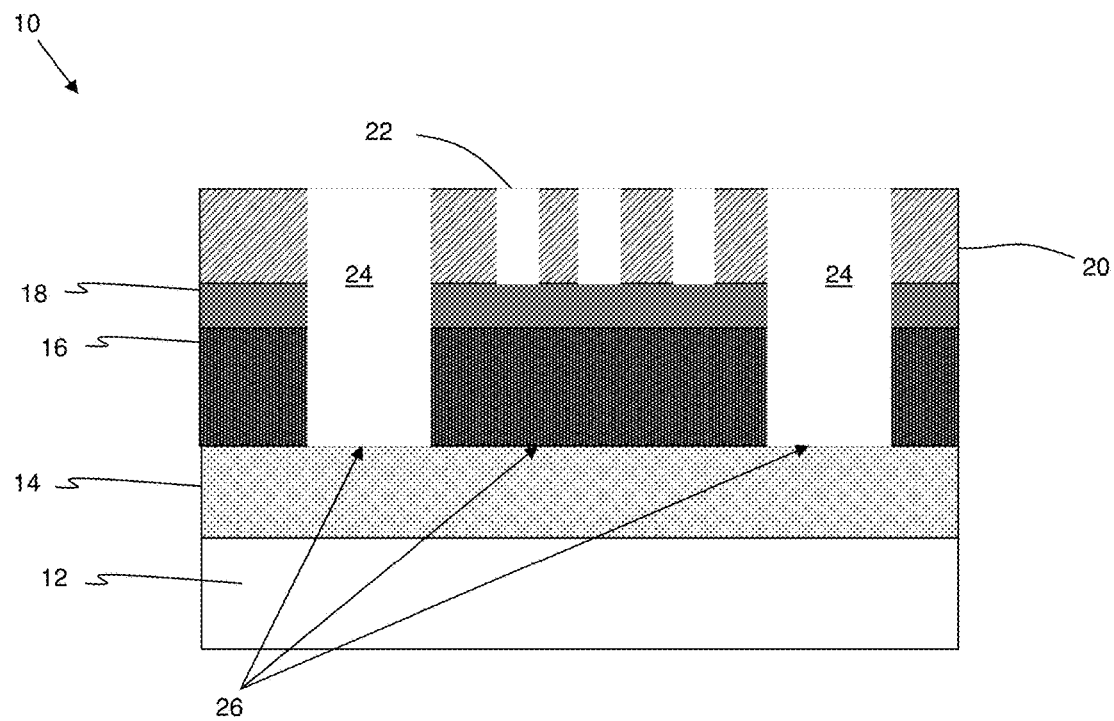
FIG. 1 shows a photomask structure with a modified surface morphology in accordance with aspects of the present disclosure.

The present disclosure relates to photomask structures and, more particularly, to modified surfaces of extreme ultraviolet lithography photomasks and methods of manufacture. More specifically, the present disclosure relates to structures and methods for suppressing deep ultraviolet (DUV) radiation from affecting an imaging border of the extreme ultraviolet (EUV) photomask. Advantageously, the photomasks described herein can include a modified surface morphology within a "black border" (BB) region such that reflected DUV light is scattered away and prevented from reaching the next mirror thus reducing or eliminating radiation overlap on the design elements of the circuit. In this way, is it possible to preserve critical dimensions of the circuit design at both edges and corners of the exposure field.

EUV photomasks are typically made as flat as possible to suppress focus variations and for improved depth of focus. Furthermore, a solution to the overlapping of EUV light from adjacent fields, which causes over development of critical dimensions (CD), is to remove the absorber material and multilayer region around the exposure field to create a "black border" region. By modifying the mask to include the black border regions, EUV reflectivity can drop to about <0.05% in the black border region. Also, non-actinic (150 nm>$\lambda$>300 nm) reflectivity can be reduced to about 5-6%. The surface morphology of the black border regions is typically etched to be as flat and uniform as possible, for cleanliness and to mitigate potential source of particles, and to leverage etch-selectivity. However, despite mitigating EUV reflections from the black border regions, the flat surface will still reflect DUV. The DUV reflectivity can be about 5%-6%, which still impacts wafer CD causing a CD drop of 0.5 nm to 0.6 nm at the edge and about 1.5 nm to 2 nm in corners of the circuit design exposure field. Moreover, target DUV reflectivity must be <1.5% to reduce impact on wafer CD to acceptable levels.

A solution to the above issue is to reduce DUV light from reaching the next mirror in the scanner optics by adding EUV-transparent structures (e.g., Si) on the mirror surface to scatter unwanted DUV radiation. This is extremely difficult to implement, though. Advantageously, the present disclosure provides an improved solution to the above noted problem, while avoiding the shortcomings of other solutions such as complexity of implementation. In particular, the photomasks described herein are intentionally modified at the surface of the black border regions such that reflected DUV light is scattered away and prevented from reaching the next mirror.

The photomask structures of the present disclosure can be manufactured in a number of ways using a number of different tools. In general, though, the methodologies and tools are used to form structures with dimensions in the micrometer and nanometer scale. The methodologies, i.e., technologies, employed to manufacture the photomask structures of the present disclosure have been adopted from integrated circuit (IC) technology. For example, the structures are built on wafers and are realized in films of material patterned by photolithographic processes on the top of a wafer. In particular, the fabrication of the photomask structures uses three basic building blocks: (i) deposition of thin films of material on a substrate, (ii) applying a patterned mask on top of the films by photolithographic imaging, and (iii) etching the films selectively to the mask.

FIG. 1 shows a photomask structure with a modified surface morphology in accordance with aspects of the present disclosure. In particular, the photomask structure 10 includes a backside material 12 formed on a substrate 14. In embodiments, the backside material 12 can be chrome or other metal coating. The chrome or other metal coating can be formed using conventional CMOS technologies, such as electroplating or other deposition methods (e.g., PECVD for other metals) known to those of skill in the art. In embodiments, the backside material 12 will be placed on a chuck by electrostatic forces. The substrate 14 can be a glass substrate as an example, although other non-reflective materials are also contemplated herein.

Still referring to FIG. 1, a multilayer reflective coating 16 is formed on the substrate 14. As shown, the multilayer reflective coating 16 is formed on the substrate 14, on an opposing surface to the backside material 12. In embodiments, the multilayer reflective coating 16 comprises alternating layers of high and low atomic number materials. By way of example, the alternating layers of high and low atomic number materials can comprise defect-free Mo/Si multi-layers that act to reflect light by means of interlayer interference. As should be known to those of skill in the art, Mo has a high atomic number; whereas, Si has a low atomic number. In embodiments, other materials with a low atomic number, e.g., Z in the 10 range, and other materials with a high atomic number, e.g., Z in the 40 range, can be used herein. Also, in embodiments, the multilayer reflective coating 16 can act as an etch stop and protective layer for subsequent processes.

In embodiments, upwards of 40 or more layers of material can be used to form the multilayer reflective coating 16. These layers can be deposited using conventional deposition methods such as, for example, chemical vapor deposition (CVD) processes. In embodiments, the uppermost layer of the multilayer reflective coating 16 should be a high atomic number material, e.g., more reflective material.

FIG. 1 further shows a protective coating 18 formed on a top surface of the multilayer reflective coating 16. In embodiments, the protective coating 18 is a film that protects the multilayer reflective coating 16 from degradation as a result of continuous use of the photomask 10. In embodiments, the protective coating 18 is a material having a high atomic number, e.g., Z in the 40 range. For example, the protective coating 18 may be Ruthenium; although other materials having a high atomic number are also contemplated herein. The protective coating 18 can be formed on the multilayer reflective coating 16 using conventional deposition processes, to a thickness in the nanometer scale, e.g., about 2 nm. In embodiments, the protective coating 18 can be deposited by ion beam deposition (IBD).

An absorber material 20 is formed on the protective coating 18. In embodiments, the absorber material 20 can be tantalum-based, e.g., TaN; although other conventional absorber materials are also contemplated for use with the structures described herein. The absorber material 20 can be deposited to a thickness of about 50 nm to about 70 nm; although other thicknesses are contemplated herein. It should be realized by those of skill in the art, though, that the thickness of the absorber material 20 can have significant effect on 3D mask effects such as horizontal-vertical bias due to shadowing, pattern shift through focus, and image contrast lost due to apodization by the reflective mask coating. In embodiments, the absorber material 20 can be deposited using conventional deposition methods such as CVD processes.

In embodiments, the photomask 10 undergoes lithography and etching processes to form patterns 22 and black border regions 24. As should be understood, the patterns 22 are representative of circuit design elements; whereas, the black border regions 24 are provided about edges of the patterns to prevent radiation overlapping as described herein. That is, the black border regions 24 reduce DUV reflectivity which impacts wafer CD causing a CD drop at the edge and corners of the circuit design.

By way of more specific example, the patterns 22 can be formed by placing a resist on the absorber material 20 and exposing it to energy (e.g., light) to form openings (pattern). The absorber material 20 can then be patterned, e.g., etched to form openings, by conventional etching technologies with chemistries selective to the absorber material 20. In embodiments, the etching technologies can comprise dry etching methodologies such as reactive ion etching (RIE). In embodiments, the protective coating 18 will act as an etch stop during this etching process. The resist can then be removed by conventional processes such as oxygen ashing or other stripant technologies known to those of ordinary skill in the art.

Similarly, the black border regions 24 can be formed using conventional lithography and etching process. However, in this process, the black border regions 24 will be formed to the underlying substrate 14. In this way, the surface of the substrate 14 will be exposed, reducing reflectivity significantly, i.e., EUV reflectivity can drop to about <0.05% in the black border regions 24. Also, non-actinic (150 nm>$\lambda$>300 nm) reflectivity can be reduced to about 5-6%.

In addition to the black border regions 24, the morphology of the exposed surface of the substrate 14 can be modified, e.g., roughened or other scattering surfaces (as represented at reference numeral 26) to further reduce overlap issues, e.g., over development of critical dimensions (CD). In particular, the modified surface 26 will reflect or scatter DUV light preventing it from reaching the next mirror. In this way, the modified surface morphology can be used to prevent radiation overlap and over exposure of the design circuit elements at the edges and corners.

Figure 2A:
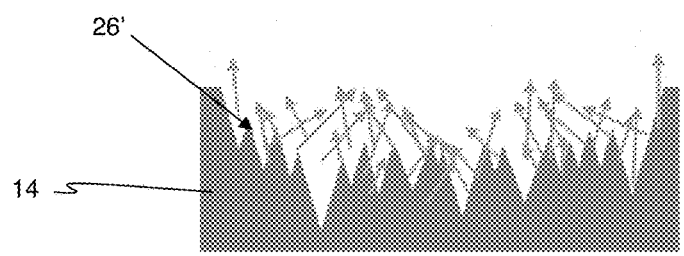
FIGS. 2a-2c show different surface morphologies within a black border region in accordance with aspects of the present disclosure.
Figure 2B:
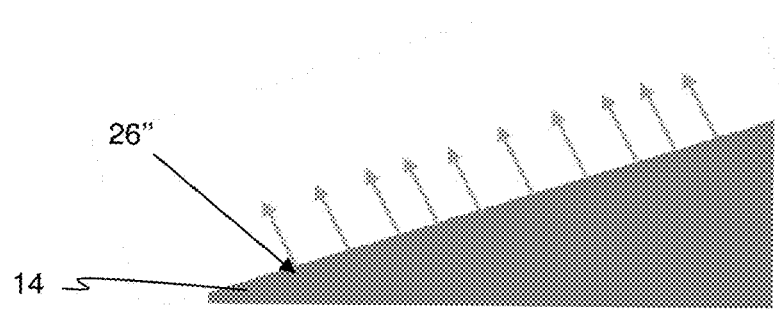
Figure 2C:
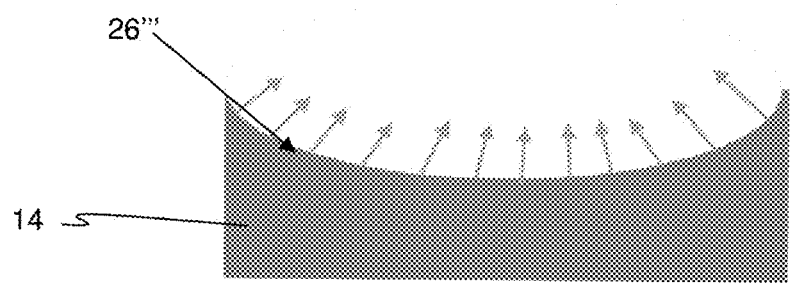

FIGS. 2a-2c show different surface morphologies within the black border regions in accordance with aspects of the present disclosure. In embodiments, the modified surface 26 can be formed by different methodologies, resulting in different surface topographies. For example, as shown representatively in FIG. 2a, the modified surface 26' can be a roughened surface resulting in a random angle scattering. As shown in FIG. 2b, the modified surface 26" can be sloped surface of a constant angle, e.g., about 20 degrees, resulting in a constant angle scattering away from the next mirror. Moreover, as shown in FIG. 2c, the modified surface 26'" can be a sloped surface at a variable angle, e.g., parabolic or concave surface, resulting in a variable angle scattering away from the next mirror. In embodiments of FIGS. 2b and 2c, the sloped surfaces will cause scattering of the light at predefined angles.

More specifically, and referring to FIG. 2a, the modified surface 26', i.e., roughened random angle scattering surface, can be formed by an additional selective substrate etch to roughen the surface of the substrate 14. For example, the roughened surface 26' can be formed by a different etch chemistry, e.g., fluorine based chemistry, than used to form the back border 24. In embodiments, the fluorine based etch chemistry can be used with the same mask that was used to form the black border regions 24, hence reducing overall manufacturing costs. In embodiments, the roughened surface can be formed by a programmed roughness of the surface, during or after black region formation. As should now be understood, the roughened surface 26' will result in random light scattering.

In alternative embodiments, the modified surface 26' can be representative of different shaped surfaces which would reflect the light away from subsequent mirrors, as an example. These different shapes can be pyramid shaped, rod shaped, pillar shaped, etc. In these embodiments, after forming the black border regions 24 and stripping the resist, a second level patterning and etch step can be performed, post black border region fabrication. In this process, after black border region formation, a resist can be formed over the entire mask and patterned to form the different shapes, using conventional lithography processes. The different shapes can then be transferred to the surface of the substrate 14 within the black border region 24 by conventional etching processes, e.g., RIE with selective chemistries, forming the particularly shaped surface morphology.

Referring to FIG. 2b, the modified surfaces 26" can be a sloped surface formed post black border region fabrication. In FIG. 2c, the modified surface 26''' can be a variable angle surface, formed post black border region fabrication. In the methodologies to form these different modified surfaces, e.g., modified surfaces 26" and 26''', the post-develop resist profile can be varied by exposure to a varying dose of energy. For example, for the modified surface 26", the exposure dosage can be varied such that the post-develop resist profile varies from thick to thin (e.g., forming a sloped or angled surface); whereas, for the modified surface 26''', the exposure dosage can be varied such that the post-develop resist profile varies from thick to thin to thick (e.g., forming a concave or parabolic surface). This is then followed by an etching process, e.g., RIE, to transfer the resist profile to the surface of the exposed surface of the substrate 14, hence forming the sloped surface 26" shown in FIG. 2b or the sloped surface 26''' formed in FIG. 2c.

In alternative embodiments, the sloped profile 26" can be formed by tilting the inductors in the etch chamber to induce a power gradient distribution during black border region etch to intentionally etch a sloped surface, e.g., resulting in a sloped etch profile 26" within the black border regions 24 shown in FIG. 2b. This same process can be used to form the variable angle profile 26''' within the black border regions 24 shown in FIG. 2c. Alternatively, the gas flow in etch chamber can be modulated to create a gradient density of plasma, resulting in sloped etch profiles shown in FIGS. 2b and 2c.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
 a reflective surface comprising a patterned design within an absorber material; and
 a black border region at edges of the patterned design, the black border region comprising a modified surface morphology of an underlying substrate to direct light away from reaching a subsequent mirror.

2. The structure of claim 1, further comprising a protective coating on the reflective surface and the absorber layer on the protective coating, wherein a patterned design is formed within the absorber layer, to the protective coating and the black border region is formed through the reflective surface, the protective coating and the absorber layer, exposing a surface of the substrate such that the modified surface morphology is provided on the underlying substrate of the reflective surface, within the black border region.

3. The structure of claim 2, wherein the substrate is glass.

4. The structure of claim 2, wherein the modified surface morphology is a roughened surface.

5. The structure of claim 2, wherein the modified surface morphology is a sloped surface.

6. The structure of claim 5, wherein the sloped surface is an angled surface.

7. The structure of claim 6, wherein the angled surface is a constant angled surface.

8. The structure of claim 5, wherein the sloped surface is a variable angle surface.

9. The structure of claim 8, wherein the variable angle surface is a parabolic or concave surface.

10. The structure of claim 2, wherein the modified surface morphology is a shaped surface comprising one of rods, pillars and pyramids.

11. A structure, comprising:
 a substrate;
 a reflective surface on an opposing surface of the substrate, comprising a plurality of alternating layers of relative high and low atomic number materials;
 a protective coating on the reflective surface;
 an absorber layer on the protective coating;
 a patterned design formed within the absorber layer, to the protective coating; and
 a black border region formed through the reflective surface, the protective coating and the absorber layer, exposing a surface of the substrate, the black border region comprising a modified surface morphology of the substrate.

12. The structure of claim 11, wherein the modified surface morphology is a roughened surface.

13. The structure of claim 11, wherein the modified surface morphology is a sloped surface.

14. The structure of claim 11, wherein the sloped surface is a constant angled surface.

15. The structure of claim 11, wherein the sloped surface is variable angle surface.

16. The structure of claim 11, wherein the modified surface morphology is a shaped surface comprising rods, pillars or pyramids.

17. A method comprising:
   forming a black border region in a mask through a reflective surface, a protective coating on the reflective surface and an absorber layer on the protective coating and exposing an underlying substrate; and
   modifying a surface morphology of the substrate of the black border region to cause light scattering of deep ultra violet light from reaching a next mirror.

18. The method of claim 17, wherein the modifying the surface morphology comprises roughening a surface of the black border region by a selective etch process or programmed roughness, post black border region formation.

19. The method of claim 17, wherein the modifying the surface morphology comprises varying an energy dose across a resist over the back border region to form a gradient resist profile, and etching the sloped resist profile to transfer the slope into a surface of the black border region.

20. The method of claim 17, wherein the modifying the surface morphology comprises creating one of:
   a gradient power distribution across the black border region by tilting etch chamber inductors to intentionally etch a sloped surface of the black border region; and
   a plasma density gradient across the black border region by modifying gas flow in the etch chamber to intentionally etch the sloped surface of the black border region.

* * * * *